United States Patent
Sewell et al.

(10) Patent No.: US 9,935,213 B2
(45) Date of Patent: Apr. 3, 2018

(54) WIRE-BASED METALLIZATION FOR SOLAR CELLS

(71) Applicant: SUNPOWER CORPORATION, San Jose, CA (US)

(72) Inventors: Richard Hamilton Sewell, Los Altos, CA (US); Robert Woehl, San Jose, CA (US); Jens Dirk Moschner, Heverlee (BE); Nils-Peter Harder, San Jose, CA (US)

(73) Assignees: SunPower Corporation, San Jose, CA (US); Total Marketing Services, Puteaux (FR)

( * ) Notice: Subject to any disclaimer, the term of this patent is extended or adjusted under 35 U.S.C. 154(b) by 179 days.

(21) Appl. No.: 14/752,818

(22) Filed: Jun. 26, 2015

(65) Prior Publication Data

US 2016/0380134 A1 Dec. 29, 2016

(51) Int. Cl.
*H01L 31/044* (2014.01)
*H01L 31/0224* (2006.01)
*H01L 31/068* (2012.01)

(52) U.S. Cl.
CPC .. *H01L 31/022441* (2013.01); *H01L 31/0682* (2013.01); *Y02E 10/547* (2013.01)

(58) Field of Classification Search
CPC ........ H01L 31/00–31/078; Y02E 10/50–10/60
USPC .................................................. 136/243–265
See application file for complete search history.

(56) References Cited

U.S. PATENT DOCUMENTS

| 2008/0216887 | A1 | 9/2008 | Hacke et al. |
| 2008/0276981 | A1* | 11/2008 | Kinoshita ......... H01L 31/02242 136/244 |
| 2009/0126788 | A1 | 5/2009 | Hishida et al. |
| 2011/0120530 | A1* | 5/2011 | Isaka ................. B32B 17/10018 136/251 |
| 2012/0204938 | A1 | 8/2012 | Hacke et al. |

(Continued)

FOREIGN PATENT DOCUMENTS

| CN | 204088344 | | 1/2015 |
| FR | WO2014095991 | * | 6/2014 |
| KR | 20130034867 | | 4/2013 |

(Continued)

OTHER PUBLICATIONS

Lin et al., CN204088344, English translation, published Jan. 7, 2015.*

(Continued)

*Primary Examiner* — Bach T Dinh
(74) *Attorney, Agent, or Firm* — Schwabe, Williamson & Wyatt, P.C.

(57) ABSTRACT

Approaches for fabricating wire-based metallization for solar cells, and the resulting solar cells, are described. In an example, a solar cell includes a substrate having a back surface and an opposing light-receiving surface. A plurality of alternating N-type and P-type semiconductor regions is disposed in or above the back surface of the substrate. A conductive contact structure is disposed on the plurality of alternating N-type and P-type semiconductor regions. The conductive contact structure includes a plurality of metal wires. Each metal wire of the plurality of metal wires is parallel along a first direction to form a one-dimensional layout of a metallization layer for the solar cell.

19 Claims, 7 Drawing Sheets

(56) References Cited

U.S. PATENT DOCUMENTS

2013/0014801 A1* 1/2013 Chen .................. H01L 31/0516
                                                        136/244
2015/0340529 A1* 11/2015 Gillot ................. H01L 31/0512
                                                        136/251

FOREIGN PATENT DOCUMENTS

| TW | 201304169 | 1/2013 |
|---|---|---|
| WO | WO-2014117216 | 8/2014 |
| WO | WO-2014163491 | 10/2014 |

OTHER PUBLICATIONS

International Search Report and Written Opinion for PCT Patent Application No. PCT/US16/39101 dated Sep. 29, 2016, 13 pgs.
Office Action from Taiwan Patent Application No. 105120089 dated Jan. 9, 2018, 8 pgs.

* cited by examiner

WIRE-BASED METALLIZATION FOR SOLAR CELLS

TECHNICAL FIELD

Embodiments of the present disclosure are in the field of renewable energy and, in particular, include approaches for fabricating wire-based metallization for solar cells, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

Figure 1:
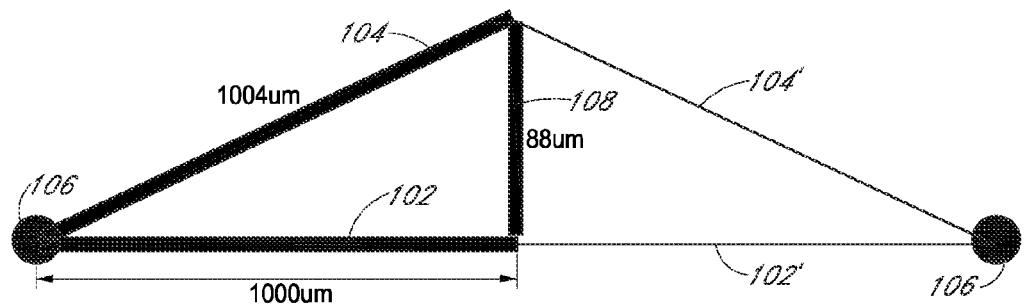
FIG. 1 illustrates a geometrical consideration for strain relief, in accordance with an embodiment of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Approaches for fabricating wire-based metallization for solar cells, and the resulting solar cells, are described herein. In the following description, numerous specific details are set forth, such as specific paste compositions and process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are solar cells. In one embodiment, a solar cell includes a substrate having a back surface and an opposing light-receiving surface. A plurality of alternating N-type and P-type semiconductor regions is disposed in or above the back surface of the substrate. A conductive contact structure is disposed on the plurality of alternating N-type and P-type semiconductor regions. The conductive contact structure includes a plurality of metal wires. Each metal wire of the plurality of metal wires is parallel along a first direction to form a one-dimensional layout of a metallization layer for the solar cell.

Also disclosed herein are methods of fabricating a solar cell. In an embodiment, a method of fabricating a solar cell includes forming a plurality of alternating N-type and P-type semiconductor regions in or above a back surface of a substrate, opposite a light-receiving surface of the substrate. The method also includes forming a metal seed layer on the plurality of alternating N-type and P-type semiconductor regions. The method also includes electrically connecting a plurality of metal wires to the metal seed layer. Each metal wire of the plurality of metal wires is parallel along a first direction to form a one-dimensional layout of a metallization layer for the solar cell.

Also disclosed herein are photovoltaic assemblies. In one embodiment, a photovoltaic assembly includes a plurality of substrates. Each substrate has a back surface and an opposing light-receiving surface. A plurality of alternating N-type and P-type semiconductor regions is disposed in or above the back surface of each of the plurality of substrates. A conductive contact structure is disposed on the plurality of alternating N-type and P-type semiconductor regions of each of the substrates. The conductive contact structure includes a plurality of metal wires. Each metal wire of the plurality of metal wires is parallel along a first direction to form a one-dimensional layout of a metallization layer for each of the substrates. One or more wires of the plurality of metal wires is common to two or more of the plurality of substrates.

One or more embodiments described herein are directed to wire based metallization of solar cells. An advantage of devices and methods described herein is the enablement of more cost effective solar cell manufacturing. For example, the disclosed devices and methods to form such devices do not involve the use of electroplating to achieve a required grid conductivity. Instead, in an embodiment, the disclosed devices and methods to form such devices involve the use of structured wires of sufficient conductivity. The structured wires are then bonded to an existing metallization layer on the solar cell. In accordance with one or more embodiments described herein, the devices and methods described below focus on the mechanical structuring of the wire such that a high density of interconnects can be achieved. Also, in one embodiment, a degree of strain relief can be incorporated into the wire grid.

To provide context, then, embodiments described herein provide a more cost effective cell metallization process by removing an electroplating operation from the process flow. Furthermore, there is also a possible efficiency benefit by removing the need for fabrication of bonding pads on the cell.

To provide further context, it is to be appreciated that the first on cell metallization layers (M1) are typically formed by sputtering or evaporation. Such M1 layers are relatively expensive vacuum based processes, and the thickness of such layers is limited to less than about 3 microns to prevent wafer bowing during a subsequent forming gas anneal process. Furthermore, the associated cost of deposition and patterning of M1 increases with the thickness of M1. Therefore, it may be advantageous for M1 to be fabricated as thin as possible, and yet enable a low resistance metal-semiconductor contact. However, the resistance of a thin (e.g., less than 3 micron) M1 may be too high to efficiently extract current from the interior of the cell to the edges. Accordingly, a second metallization (M2) layer is often incorporated onto the solar cell. Electroplated metal features or metal foil based features have been used in the past. By contrast, in accordance with embodiments described herein, a plurality of wires is implemented effectively as an M2 layer.

In accordance with an embodiment of the present disclosure, the most efficient geometry for M1 is a plurality of parallel lines, spaced as close together as process design rules allow. The most efficient geometry for M2, then, is also a plurality of parallel lines with the same pitch and parallel to M1. Such an arrangement provides the shortest current path to the appropriate edge of the wafer. An alternative geometry is where the conductive M2 lines run perpendicular to M1 and are interconnected such that adjacent M2 lines are connected only to N-type or to P-type contacts, respectively, on the wafer.

In accordance with one or more embodiments described herein, a solder is used to bond a wire (M2) to a thin M1 layer. It is to be appreciated, however, that if a straight wire is soldered at once to M1, the thermal mismatch between an underlying silicon substrate or layer and M2 may induce a bowing in the cell as it cools down from soldering temperature. To avoid cell bowing, in an embodiment, the wire is formed and soldered in a way such that the M2 is permitted to contract as it cools, without inducing bending in the cell. In one approach, strain relief features are included in the wires to address such issues, as is described in greater detail below. Alternatively, in another embodiment, M2 is bonded to M1 without heating the entire assembly, e.g., by laser soldering or laser welding, and M2 (the plurality of wires) can be a plurality of straight wire without strain relief features across the cell. In an embodiment, the cross section of the wire (e.g., the wire end) is round or square. In the latter embodiment, a benefit of such a square wire is to provide more contact area between the M1 and M2 layers.

In accordance with one or more embodiments of the present disclosure, strain relief features are incorporated into a solar cell metallization structure based on wires. Two approaches may be considered for wire based strain relief:

(1) in-plane strain relief and (2) out-of-plane. In an embodiment, both approaches involve M1 to M2 bonding at multiple discrete points along the wire. Factors for consideration include the bonding temperature and the length of wire contained between two adjacent bonding points, which is longer than the straight line distance. When the structure is cooled after bonding, the bending force of the wafer is reduced. Furthermore, the strain on the bonds and wafer due to thermal cycling in normal solar cell operation is reduced by the strain relief.

Figure 2:
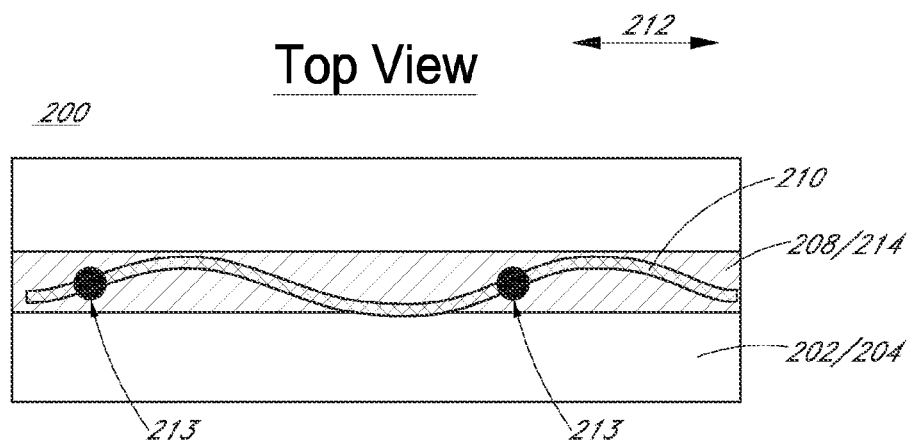
FIG. 2 illustrates plan view of the back side of a solar cell having wire-based metallization, and the corresponding cross-sectional view, in accordance with an embodiment of the present disclosure.
Figure 2:
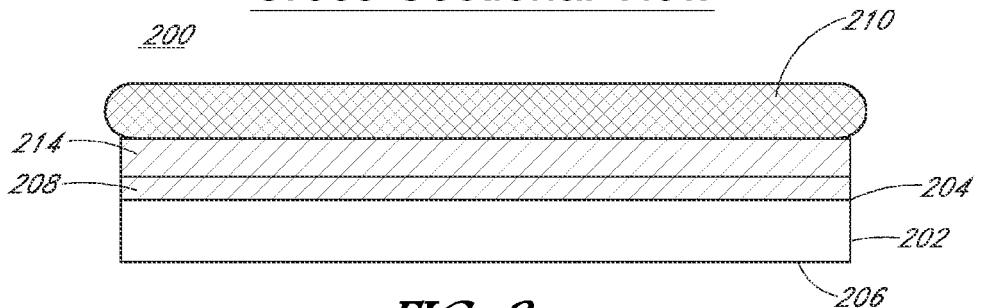
Figure 3:
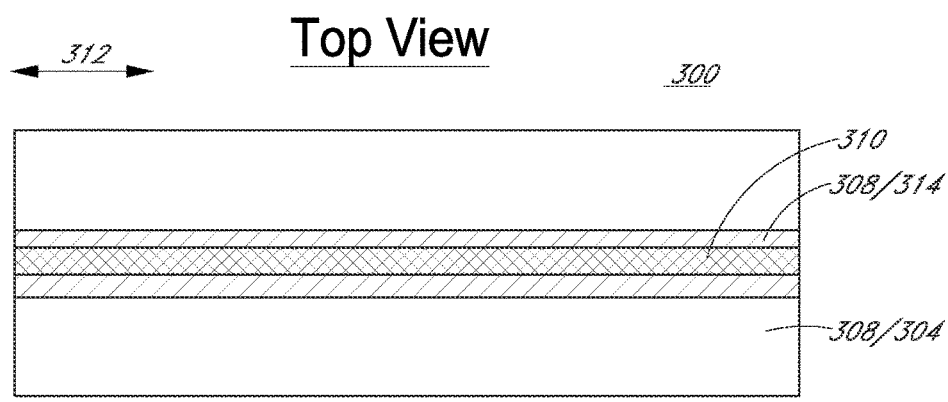
FIG. 3 illustrates plan view of the back side of another solar cell having wire-based metallization, and the corresponding cross-sectional view, in accordance with another embodiment of the present disclosure.
Figure 3:
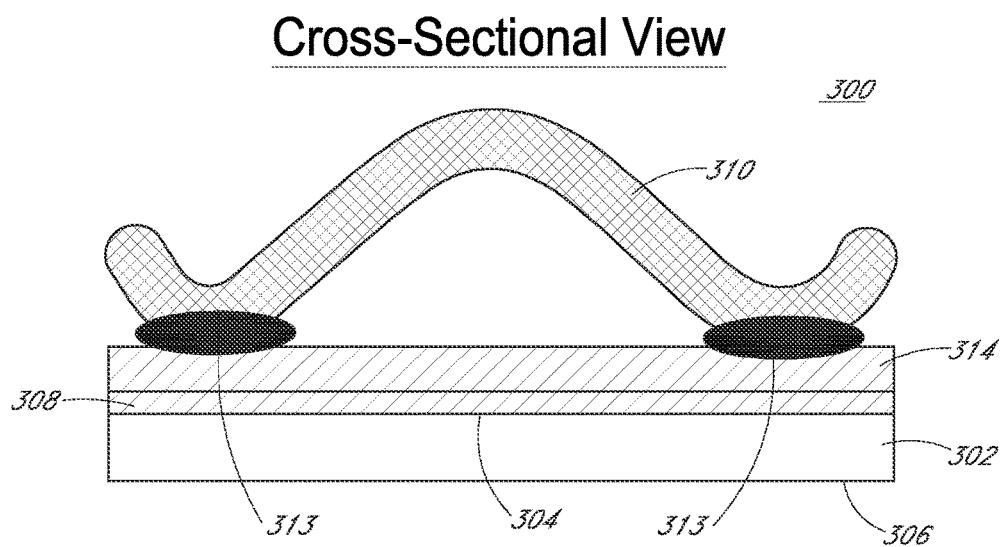
Figure 4:
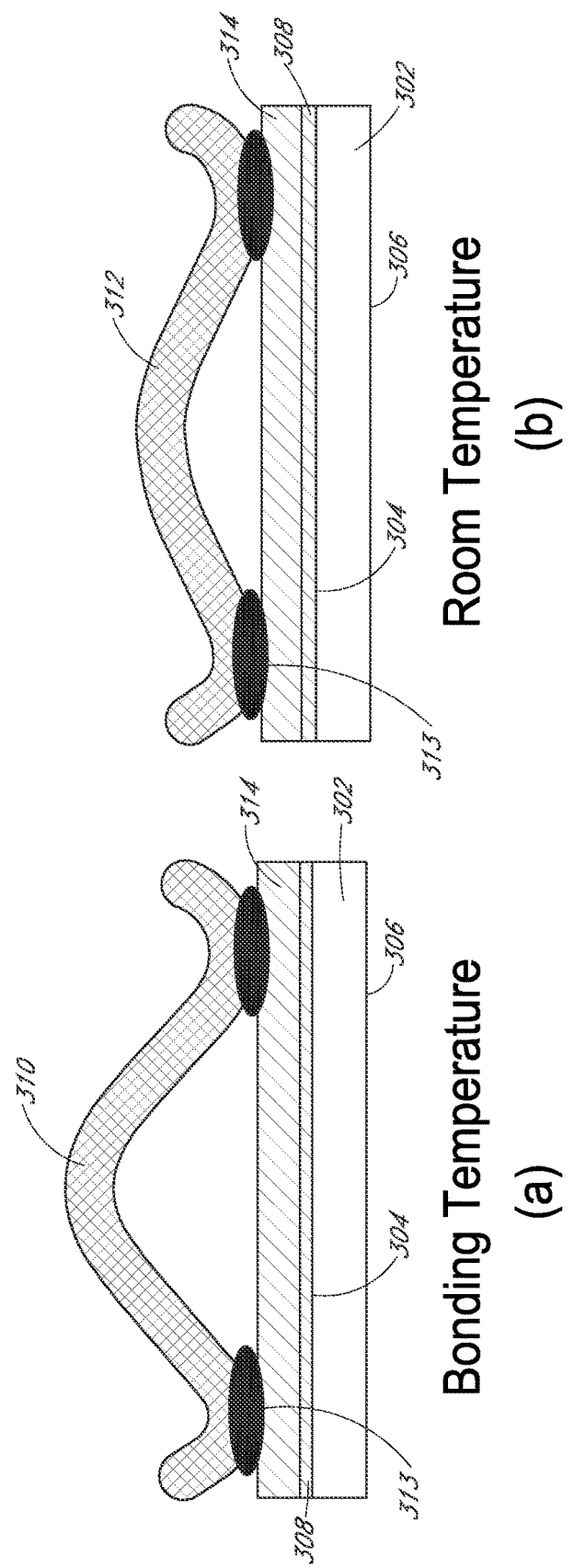
FIG. 4 illustrates the metallization arrangement of FIG. 3, as depicted at (a) a bonding temperature and (b) room temperature, in accordance with an embodiment of the present disclosure.

In an exemplary embodiment that accounts for strain relief, to calculate the amount of deformation required, it is considered that copper has a linear coefficient of thermal expansion (CTE) of 17E-6. It is assumed that a solder connection solidifies at approximately 250 degrees Celsius. Cooling from 250 degrees Celsius to 20 degrees Celsius after bonding leads to a factor of contraction of 0.00391 of the original length. FIG. 1 illustrates a geometrical consideration for strain relief, in accordance with an embodiment of the present disclosure. Referring to FIG. 1, segment 102 represents half the portion of a wire 102/102' at 20 degrees Celsius. Segment 104 represents half the wire 104/104' at the bond temperature for a 2 mm bond spacing (i.e., between bond points 106). At 250 degrees Celsius, the length of segment 104 is 1.00391×1000 microns which equals 1004 microns. The height 108 of 88 microns represents the minimum amount of bending required such that the wire (102/102' or 104/104') may contract without placing any strain in the bond points 106. For a 250 micron wide M1 finger, then, in-plane strain relief may be realized by making small bends in the wire with an amplitude less than the half-width of the M1 finger width, as shown in FIG. 2, described below. Alternatively, the wire may be bent out of the plane on the wafer as shown in FIGS. 3 and 4, described below.

As a first example of wire based metallization for a solar cell, FIG. 2 illustrates plan view of the back side of a solar cell having wire-based metallization, and the corresponding cross-sectional view, in accordance with an embodiment of the present disclosure.

Referring to FIG. 2, a portion 200 of a solar cell includes a substrate 202 having a back surface 204 and an opposing light-receiving surface 206. A plurality of alternating N-type and P-type semiconductor regions (one such regions shown as 208) is disposed in or above the back surface 204 of the substrate 202. A conductive contact structure is disposed on the plurality of alternating N-type and P-type semiconductor regions 208. The conductive contact structure includes a plurality of metal wires (one metal wire shown as 210). Each metal wire 210 is bonded to the solar cell at bonding points 213, which may be solder bonds. Each metal wire 210 of the plurality of metal wires is parallel along a first direction 212 to form a one-dimensional layout of a metallization layer for the solar cell 200, examples of which are described in greater detail below in association with FIGS. 5 and 6. It is to be appreciated that instead of solder bonds, other bonding approaches may be used such as, but not limited to, thermocompression bonding, laser welding, or ultrasonic assisted welding.

Referring again to FIG. 2, in an embodiment, each metal wire 210 of the plurality of metal wires is undulating in a plane parallel with the back surface 204 of the substrate 200. In one such embodiment, the undulating geometry in the plane parallel with the back surface 204 provides a stress relief feature for the solar cell. In an embodiment, as is depicted in FIG. 2, the conductive contact structure further includes a metal seed layer 214 (i.e., an M1 layer) disposed between the plurality of alternating N-type and P-type semiconductor regions 208 and the plurality of metal wires 210.

As a second example of wire based metallization for a solar cell, FIG. 3 illustrates plan view of the back side of another solar cell having wire-based metallization, and the corresponding cross-sectional view, in accordance with another embodiment of the present disclosure.

Referring to FIG. 3, a portion 300 of a solar cell includes a substrate 302 having a back surface 304 and an opposing light-receiving surface 306. A plurality of alternating N-type and P-type semiconductor regions (one such regions shown as 308) is disposed in or above the back surface 304 of the substrate 302. A conductive contact structure is disposed on the plurality of alternating N-type and P-type semiconductor regions 308. The conductive contact structure includes a plurality of metal wires (one metal wire shown as 310). Each metal wire 310 is bonded to the solar cell at bonding points 313, which may be solder bonds. Each metal wire 310 of the plurality of metal wires is parallel along a first direction 312 to form a one-dimensional layout of a metallization layer for the solar cell 300, examples of which are described in greater detail below in association with FIGS. 5 and 6.

Referring again to FIG. 3, in an embodiment, each metal wire 310 of the plurality of metal wires is undulating in a plane normal to the back surface 304 of the substrate 300. In one such embodiment, the undulating geometry in the plane normal to the back surface 304 provides a stress relief feature for the solar cell. In an embodiment, as is depicted in FIG. 3, the conductive contact structure further includes a metal seed layer 314 (i.e., an M1 layer) disposed between the plurality of alternating N-type and P-type semiconductor regions 308 and the plurality of metal wires 310.

To demonstrate the effects of temperature on the wire geometry of wire based metallization for a solar cell, FIG. 4 illustrates the metallization arrangement of FIG. 3, as depicted at (a) a bonding temperature and (b) room temperature, in accordance with an embodiment of the present disclosure. Referring to FIG. 4, the out of plane undulation of the wire 310 is greater at the bonding temperature than at room temperature. In an exemplary embodiment, bonding temperature is approximately 250 degrees Celsius.

Figure 5:
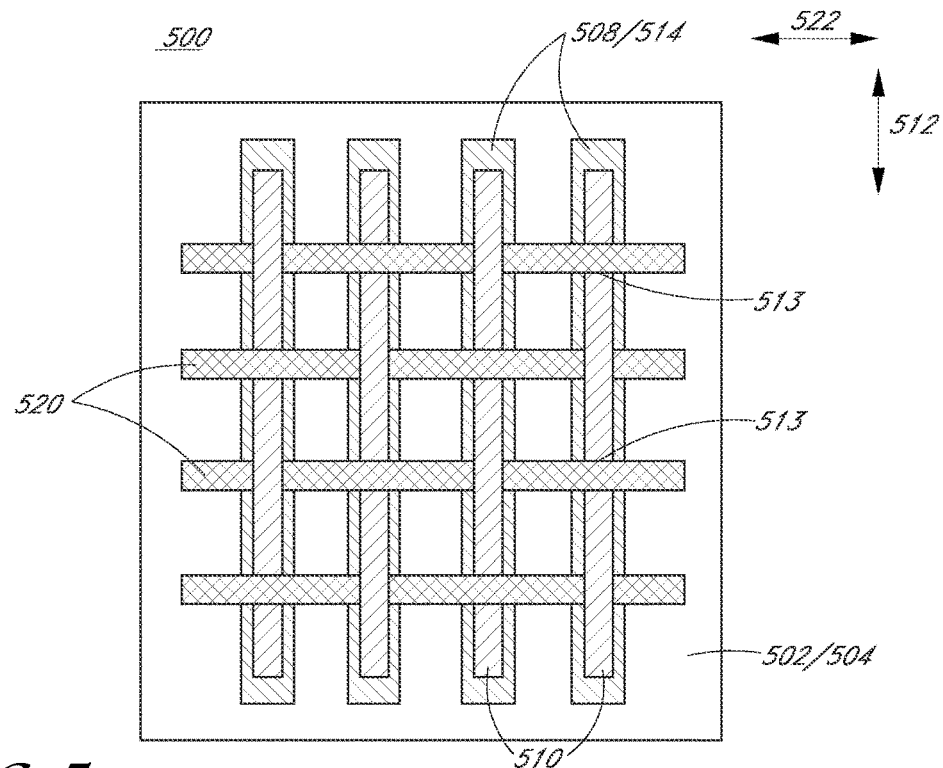
FIG. 5 illustrates plan view of the back side of a solar cell having wire-based mesh metallization, in accordance with an embodiment of the present disclosure.

In another aspect, a metallization structure for a solar cell includes woven wires. A woven wire configuration can involve the implementation of metal (e.g., Al or Cu) wires and insulating wires, which are woven into a mesh such that the metal wires can contact the metallization on the silicon cell in order to realize the lateral conductivity with metal wires. Such an arrangement may be made where the M2 (wire) layer is parallel to the M1 layer, as shown in FIG. 5, or where the M2 layer is perpendicular to M1 as, shown in FIG. 6. The contact to the cell is realized at the outer points of the metal wires (where they cross an insulating wire). The insulating wires may provide structural integrity for fabricating a non-fragile mesh which is easy to handle. In an embodiment, the insulating wires may be retained in the final cell structure, or may be removed after the mesh has been bonded to the wafer.

As a first example of wire based metallization having a mesh structure, FIG. 5 illustrates plan view of the back side of a solar cell having wire-based mesh metallization, in accordance with an embodiment of the present disclosure.

Referring to FIG. 5, a portion 500 of a solar cell includes a substrate 502 having a back surface 504 and an opposing light-receiving surface (not shown). A plurality of alternating N-type and P-type semiconductor regions 508 is disposed in or above the back surface 504 of the substrate 502.

A conductive contact structure is disposed on the plurality of alternating N-type and P-type semiconductor regions 508. The conductive contact structure includes a metal seed layer 514 (i.e., an M1 layer) disposed on the plurality of alternating N-type and P-type semiconductor regions 508. The conductive contact structure also includes a plurality of metal wires 510. Each metal wire of the plurality of metal wires 510 is bonded to the M1 layer of the solar cell at bonding points 513, which may be solder bonds. Each metal wire of the plurality of metal wires 510 is parallel along a first direction 512 to form a one-dimensional layout of a metallization layer for the solar cell 500. In an embodiment, as is depicted in FIG. 5, the plurality of alternating N-type and P-type semiconductor regions 508 is parallel along the first direction 512.

Referring again to FIG. 5, the metallization structure further includes a plurality of insulating wires 520. Each insulating wire of the plurality of insulating wires 520 is parallel along a direction 522 orthogonal to the first direction 512. In one such embodiment, each insulating wire of the plurality of insulating wires 520 is woven through the plurality of metal wires, a 1:1 alternating weaving pattern for which is depicted in FIG. 5. In an embodiment, the plurality of insulating wires 520 provides structural integrity for the plurality of metal wires 510.

Figure 6:
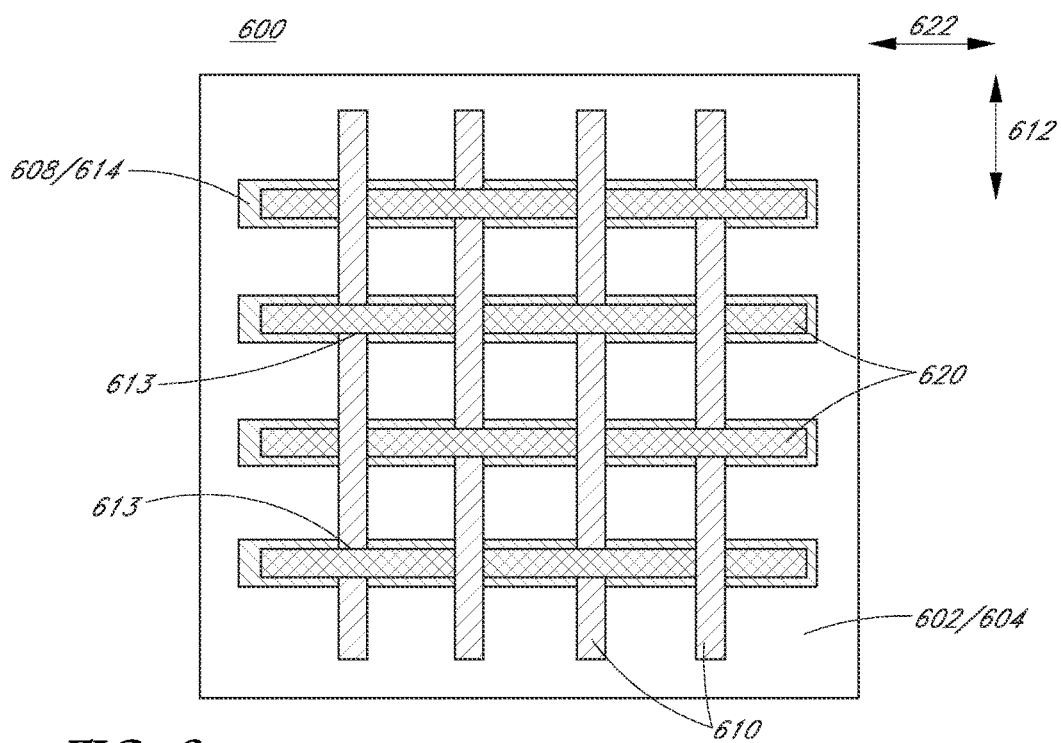
FIG. 6 illustrates plan view of the back side of another solar cell having wire-based mesh metallization, in accordance with another embodiment of the present disclosure.

As a second example of wire based metallization having a mesh structure, FIG. 6 illustrates plan view of the back side of another solar cell having wire-based mesh metallization, in accordance with another embodiment of the present disclosure.

Referring to FIG. 6, a portion 600 of a solar cell includes a substrate 602 having a back surface 604 and an opposing light-receiving surface (not shown). A plurality of alternating N-type and P-type semiconductor regions 608 is disposed in or above the back surface 604 of the substrate 602. A conductive contact structure is disposed on the plurality of alternating N-type and P-type semiconductor regions 608. The conductive contact structure includes a metal seed layer 614 (i.e., an M1 layer) disposed on the plurality of alternating N-type and P-type semiconductor regions 608. The conductive contact structure also includes a plurality of metal wires 610. Each metal wire of the plurality of metal wires 610 is bonded to the M1 layer of the solar cell at bonding points 613, which may be solder bonds. Each metal wire of the plurality of metal wires 610 is parallel along a first direction 612 to form a one-dimensional layout of a metallization layer for the solar cell 600. In an embodiment, as is depicted in FIG. 6, the plurality of alternating N-type and P-type semiconductor regions 608 is orthogonal to the first direction 612.

Referring again to FIG. 6, the metallization structure further includes a plurality of insulating wires 620. Each insulating wire of the plurality of insulating wires 620 is parallel along a direction 622 orthogonal to the first direction 612. In one such embodiment, each insulating wire of the plurality of insulating wires 620 is woven through the plurality of metal wires, a 1:1 alternating weaving pattern for which is depicted in FIG. 6. In an embodiment, the plurality of insulating wires 620 provides structural integrity for the plurality of metal wires 610.

In an embodiment, an entire mesh structure is sized to have an area approximately the same as the area of a solar cell. However, in one such embodiment, at the two ends of the metal wires, i.e., as the ends of the solar cell, the wires of one polarity (i.e., N-type or P-type underlying region) are extended to contact the opposite polarity of an adjacent cell. In an embodiment, then, a mesh of the size of entire module of a plurality of solar cells may be implemented. In one such embodiment, one wire lies above one finger with a certain polarity and conducts all the current of that finger. Next to and in parallel to that wire, another metal wire conducts the current of the opposite polarity.

In another embodiment, more than one wire contacts one finger. In such a case, the wire diameter can be reduced, and a finer mesh is achieved. The metal wires may not need to be aligned to the finger, but rather may only need to be parallel to the fingers. Where the metal wire crosses an isolating finger and where the metal wire faces the silicon wafer, the latter portion may provide an "outer point" where the wire contacts the solar cell. In an embodiment, wires that lie between the on-cell metallization do not conduct current and, hence, the alignment tolerance between mesh and cells does not need to be very fine in the direction perpendicular to the metal finger.

Figure 7A:
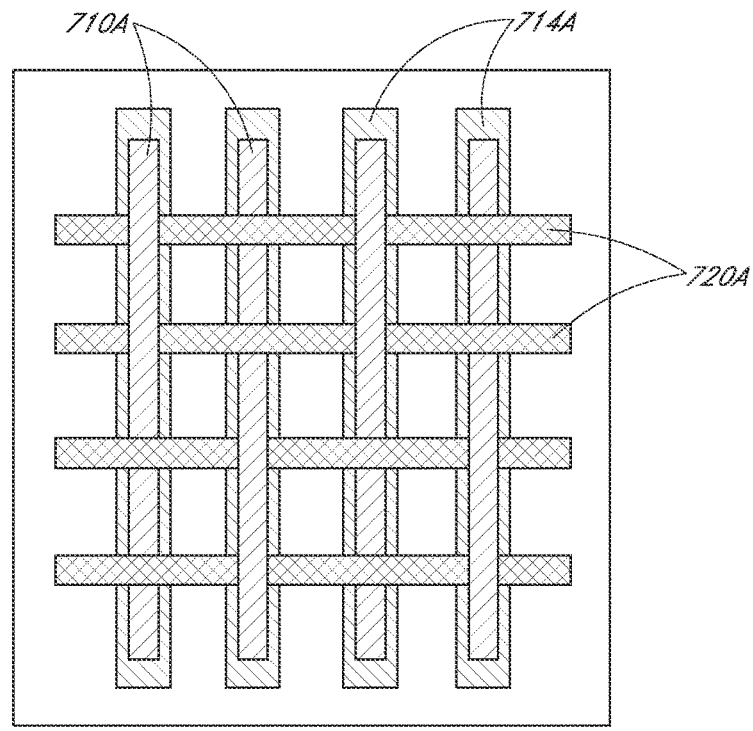
FIGS. 7A-7C illustrate plan views of the back sides of solar cells having wire-based mesh metallization, in accordance with an embodiment of the present disclosure.
Figure 7B:
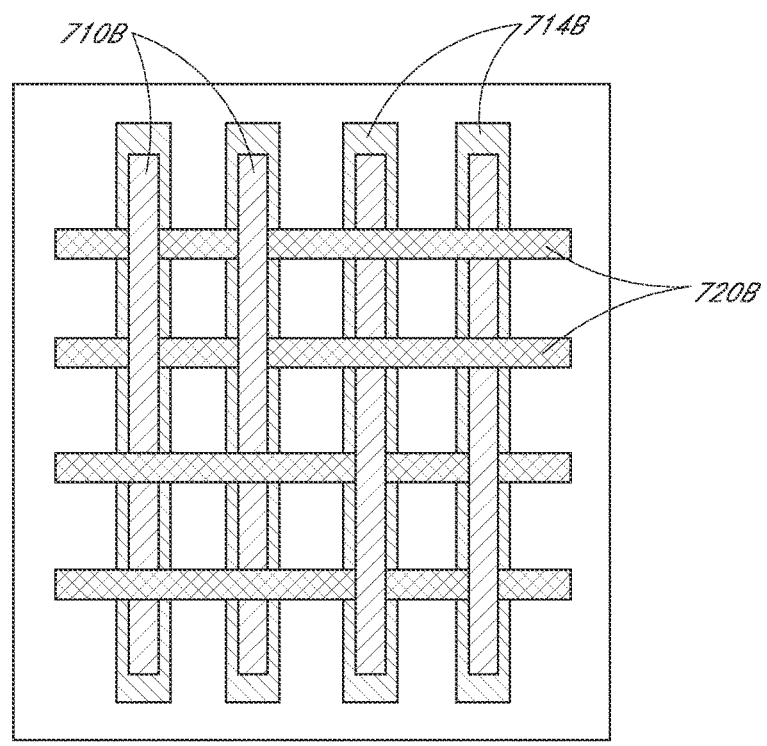
Figure 7C:
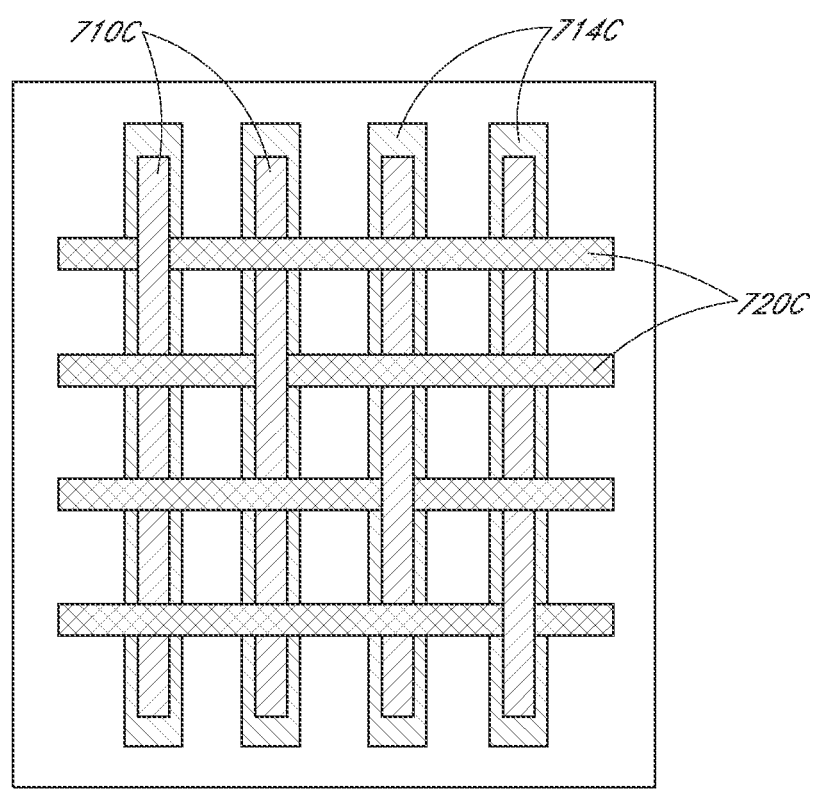

As examples of wire based metallization having a mesh structures with alternative weaving arrangements, FIGS. 7A-7C illustrate plan views of the back sides of solar cells having wire-based mesh metallization, in accordance with an embodiment of the present disclosure. Different structural arrangements may provide different levels of advantage with respect to increased contact area between M1 and M2 and/or optimized strain relief geometry.

Referring to FIG. 7A, a plurality of metal wires 710A is parallel with a plurality of M1 layers 714A. A plurality of insulating wires 720A is orthogonal to the plurality of metal wires 710A. From metal wire to metal wire within the plurality of metal wires 710A, the weaving of the metal wires is alternating by ones. With respect to the insulating wires 720A, the weaving of the metal wires is spaced for every two insulating wires.

Referring to FIG. 7B, a plurality of metal wires 710B is parallel with a plurality of M1 layers 714B. A plurality of insulating wires 720B is orthogonal to the plurality of metal wires 710B. From metal wire to metal wire within the plurality of metal wires 710B, the weaving of the metal wires is alternating by twos. With respect to the insulating wires 720B, the weaving of the metal wires is spaced for every two insulating wires.

Referring to FIG. 7C, a plurality of metal wires 710C is parallel with a plurality of M1 layers 714C. A plurality of insulating wires 720C is orthogonal to the plurality of metal wires 710C. From metal wire to metal wire within the plurality of metal wires 710C, the weaving of the metal wires is somewhat randomized. With respect to the insulating wires 720C, the weaving of the metal wires is also somewhat randomized.

With reference again to FIGS. 2-6 and 7A-7C, then, a method of fabricating a solar cell includes forming a plurality of alternating N-type and P-type semiconductor regions in or above a back surface of a substrate, opposite a light-receiving surface of the substrate. The method also includes forming a metal seed (M1) layer on the plurality of alternating N-type and P-type semiconductor regions. The method also includes electrically connecting a plurality of metal wires to the metal seed layer. Each metal wire of the plurality of metal wires is parallel along a first direction to form a one-dimensional layout of a metallization layer for the solar cell.

In an embodiment, the method further involves weaving a plurality of insulating wires through the plurality of metal wires. In an embodiment, electrically connecting the plurality of metal wires to the metal seed layer involves soldering or welding the plurality of metal wires to the metal seed layer at points along each of the metal wires of the plurality of metal wires.

Figure 8:
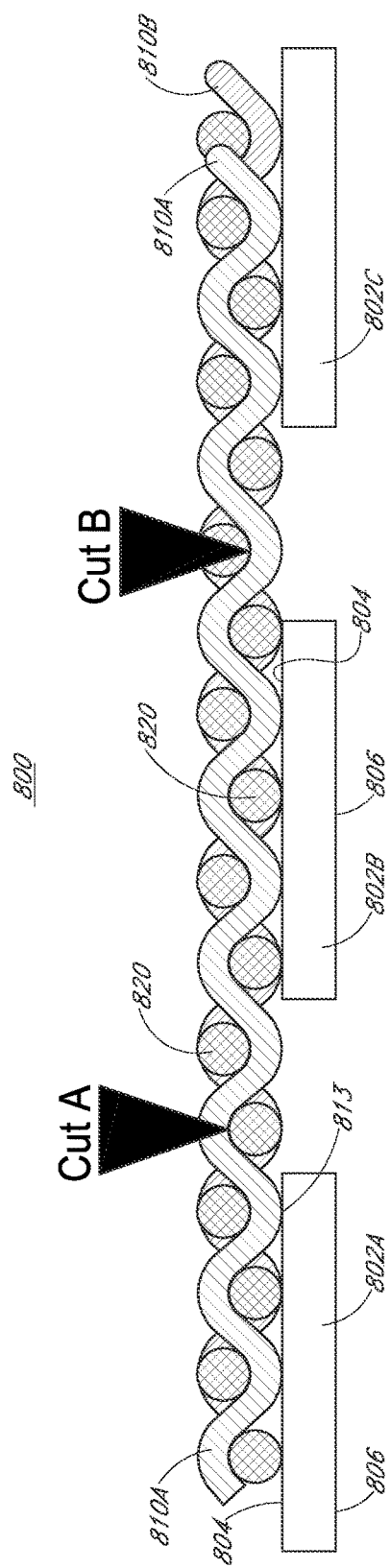
FIG. 8 illustrates a photovoltaic assembly having a mesh metallization structure, in accordance with an embodiment of the present disclosure.

In another aspect, module integration is addressed in greater detail. In an embodiment, a mesh is run along a full string of solar cells. As described in greater detail below in association with FIG. 8, in an embodiment, the plurality of metal wires is further coupled to a second substrate. In one such embodiment, one polarity of the plurality of metal wires is disconnected between substrates to form a series connection between the substrates. In a particular such embodiment, the separation of the segments is readily performed by cutting/lasering every other wire in the gap between two cells. FIG. 8 illustrates a photovoltaic assembly having a mesh metallization structure, in accordance with an embodiment of the present disclosure.

Referring to FIG. 8, a photovoltaic assembly 800 includes a plurality of substrates 802A, 802B, 802C. Each substrate has a back surface 804 and an opposing light-receiving surface 806. A plurality of alternating N-type and P-type semiconductor regions (not shown) is disposed in or above the back surface 806 of each of the plurality of substrates 802A, 802B, 802C. A conductive contact structure is disposed on the plurality of alternating N-type and P-type semiconductor regions of each of the substrates 802A, 802B, 802C. The conductive contact structure includes a plurality of metal wires, e.g., 810A and 810B. Each metal wire of the plurality of metal wires (e.g., wires 802A and 802B) is parallel along a first direction to form a one-dimensional layout of a metallization layer for each of the substrates, which are bonded at points 813. One or more wires (e.g., wire 802A) of the plurality of metal wires is common to two or more of the plurality of substrates 802A, 802B, 802C. Additionally, in one embodiment, a plurality of insulating wires 820 is included (ends are shown in FIG. 8). Each insulating wire of the plurality of insulating wires 820 is parallel along a direction orthogonal to the first direction. Furthermore, each insulating wire of the plurality of insulating wires 820 is woven through the plurality of metal wires 810A, 810B.

It is to be appreciate that the separation of the segments is readily performed by cutting/lasering every other wire in the gap between two cells. For example, in an embodiment, as is depicted in FIG. 8, all wires on top of the woven insulator wires at a certain line (Cut A), and alternating in the next gap, are cut (Cut B). Thus, a full string could be formed at once. In a specific embodiment, a wider insulator is woven in at that stage, if needed to accommodate for the cutting, or as a separator between cells.

In accordance with one or more embodiments described herein, advantages of implementations described herein include the use of a low cost (and lightweight) metal material as a lateral conductor. By comparison, to achieve the same conductivity as a plated copper finger, an aluminum wire would need to only have a diameter of approximately 100 to 200 microns. Other advantages include that the M2 is already patterned, and the wires are isolated from one other and are formed into lines. In a direction along the fingers the alignment of M1 to M2 need not be very accurate, since the wires only need to be parallel to fingers. If the metal finger width of M1 is about 250 microns and the Al wire connects the cell only on small areas, the wire does not need to be in the middle of the finger of M1, providing a high alignment tolerance. Furthermore, the bending in the metal wires provides a stress relief element which improves reliability of the module, especially with respect to thermal cycling and module bending. In an embodiment, a solar cell is thus provided where the majority of the current is extracted from the cell via a wire structure which has been formed in such a way so as to afford mechanical strain relief between discrete electrical bonding points to the wafer.

In an embodiment, conductive wires as described herein are formed of copper or aluminum, with or without a coating such as tin, silver, nickel or an organic solderability protectant. In an embodiment, the surface of each wire is mostly oxidized, with some regions where the oxide has been removed to enable solder wetting. In one embodiment, the surface of the wire is mostly coated with an insulating material, with some regions where the insulating material has been removed to enable solder wetting. In an embodiment, the wire structure is bonded to the wafer using solder with a melting point less than approximately 300 degrees Celsius. In an embodiment, a solder mask material is printed onto the cell to define discrete electrical bonding points. In an embodiment, a substantial portion of the wire is not wet by solder. In an embodiment, the wire structure is a woven mesh. In one such embodiment, the weave or weft threads are insulating. In one embodiment, the weave and weft of the wires contact alternate polarities respectively on the wafer.

In an embodiment, a substrate as described herein is a monocrystalline silicon substrate, such as a bulk single crystalline N-type doped silicon substrate. It is to be appreciated, however, that the substrate may be a layer, such as a multi-crystalline silicon layer, disposed on a global solar cell substrate.

In an embodiment, alternating N-type and P-type semiconductor regions described herein are formed from polycrystalline silicon and are formed above a substrate. In one such embodiment, the N-type polycrystalline silicon emitter regions are doped with an N-type impurity, such as phosphorus. The P-type polycrystalline silicon emitter regions are doped with a P-type impurity, such as boron. The alternating N-type and P-type semiconductor regions may have trenches formed there between, the trenches extending partially into the substrate. Additionally, although not depicted, in one embodiment, a bottom anti-reflective coating (BARC) material (also known as a rear dielectric), or other protective layer (such as a layer amorphous silicon) may be formed on the alternating N-type and P-type semiconductor regions. The alternating N-type and P-type semiconductor regions may be formed on a thin dielectric tunneling layer formed on the back surface of the substrate. In another embodiment, alternating N-type and P-type semiconductor regions described herein are formed as a plurality of N-type and P-type diffusion regions formed in monocrystalline silicon substrate.

In an embodiment, a light receiving surface of a solar cell as described herein may be a texturized light-receiving surface. In one embodiment, a hydroxide-based wet etchant is employed to texturize the light receiving surface of the substrate. In an embodiment, a texturized surface may be one which has a regular or an irregular shaped surface for scattering incoming light, decreasing the amount of light reflected off of the light receiving surface of the solar cell. Additional embodiments can include formation of a passivation and/or anti-reflective coating (ARC) layers on the light-receiving surface.

In an embodiment, an M1 layer, if included, is a plurality of metal seed material regions. In a particular such embodiment, the metal seed material regions are aluminum regions each having a thickness approximately in the range of 0.3 to 20 microns and composed of aluminum in an amount greater than approximately 97% and silicon in an amount approximately in the range of 0-2%. It is to be appreciated that embodiments described herein involve use of a metal seed (M1) layer. Optionally, in other embodiment, an M1 layer is omitted and the wires make direct contact with the silicon.

Although certain materials are described specifically with reference to above described embodiments, some materials may be readily substituted with others with other such embodiments remaining within the spirit and scope of embodiments of the present disclosure. For example, in an embodiment, a different material substrate, such as a group III-V material substrate, can be used instead of a silicon substrate. Additionally, although reference is made significantly to back contact solar cell arrangements, it is to be appreciated that approaches described herein may have application to front contact solar cells as well. In other embodiments, the above described approaches can be applicable to manufacturing of other than solar cells. For example, manufacturing of light emitting diode (LEDs) may benefit from approaches described herein.

Thus, approaches for fabricating wire-based metallization for solar cells, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, comprising:
    a substrate having a back surface and an opposing light-receiving surface;
    a plurality of alternating N-type and P-type semiconductor regions disposed in or above the back surface of the substrate, each of the plurality of alternating N-type and P-type semiconductor regions having a length along a first direction; and
    a conductive contact structure disposed on the plurality of alternating N-type and P-type semiconductor regions, the conductive contact structure comprising a plurality of metal wires, wherein each metal wire of the plurality of metal wires is parallel along the first direction to form a one-dimensional layout of a metallization layer for the solar cell, wherein each metal wire of the plurality of metal wires is associated with only a single one of the plurality of alternating N-type and P-type semiconductor regions, and wherein each metal wire of the plurality of metal wires is continuously undulating between and extending beyond two bonding points coupling the metal wire to the plurality of alternating N-type and P-type semiconductor regions.

2. The solar cell of claim 1, wherein each metal wire of the plurality of metal wires is undulating in a plane parallel with the back surface of the substrate.

3. The solar cell of claim 1, wherein each metal wire of the plurality of metal wires is undulating in a plane normal to the back surface of the substrate.

4. The solar cell of claim 1, wherein each metal wire of the plurality of metal wires comprises a stress relief feature.

5. The solar cell of claim 1, further comprising:
    a plurality of insulating wires, wherein each insulating wire of the plurality of insulating wires is parallel along a direction orthogonal to the first direction.

6. The solar cell of claim 5, wherein each insulating wire of the plurality of insulating wires is woven through the plurality of metal wires.

7. The solar cell of claim 6, wherein the plurality of insulating wires provides structural integrity for the plurality of metal wires.

8. The solar cell of claim 1, wherein the conductive contact structure further comprises a metal seed layer disposed between the plurality of alternating N-type and P-type semiconductor regions and the plurality of metal wires.

9. The solar cell of claim 1, wherein the substrate is a monocrystalline silicon substrate, and wherein the plurality of alternating N-type and P-type semiconductor regions is a plurality of N-type and P-type diffusion regions formed in the silicon substrate.

10. The solar cell of claim 1, wherein plurality of alternating N-type and P-type semiconductor regions is a plurality of N-type and P-type polycrystalline silicon regions formed above the back surface of the substrate.

11. A photovoltaic assembly, comprising:
    a plurality of substrates, each substrate having a back surface and an opposing light-receiving surface;
    a plurality of alternating N-type and P-type semiconductor regions disposed in or above the back surface of each of the plurality of substrates, each of the plurality of alternating N-type and P-type semiconductor regions having a length along a first direction; and
    a conductive contact structure disposed on the plurality of alternating N-type and P-type semiconductor regions of each of the substrates, the conductive contact structure comprising a plurality of metal wires, wherein each metal wire of the plurality of metal wires is parallel along the first direction to form a one-dimensional layout of a metallization layer for each of the substrates, wherein, for a single substrate each metal wire of the plurality of metal wires is associated with only a single one of the plurality of alternating N-type and P-type semiconductor regions, wherein one or more wires of the plurality of metal wires is common to two or more of the plurality of substrates, and wherein each metal wire of the plurality of metal wires is continuously undulating between and extending beyond two bonding points coupling the metal wire to the plurality of alternating N-type and P-type semiconductor regions.

12. The photovoltaic assembly of claim 11, wherein each metal wire of the plurality of metal wires comprises a stress relief feature.

13. The photovoltaic assembly of claim 11, further comprising:
    a plurality of insulating wires, wherein each insulating wire of the plurality of insulating wires is parallel along a direction orthogonal to the first direction, wherein each insulating wire of the plurality of insulating wires is woven through the plurality of metal wires, and wherein the plurality of insulating wires provides structural integrity for the plurality of metal wires.

14. The photovoltaic assembly of claim 11, wherein the conductive contact structure further comprises a metal seed layer disposed between the plurality of alternating N-type and P-type semiconductor regions of each substrate and the plurality of metal wires.

15. A method of fabricating a solar cell, the method comprising:

forming a plurality of alternating N-type and P-type semiconductor regions in or above a back surface of a substrate, opposite a light-receiving surface of the substrate, each of the plurality of alternating N-type and P-type semiconductor regions having a length along a first direction;

forming a metal seed layer on the plurality of alternating N-type and P-type semiconductor regions; and electrically connecting a plurality of metal wires to the metal seed layer, wherein each metal wire of the plurality of metal wires is parallel along the first direction to form a one-dimensional layout of a metallization layer for the solar cell, wherein each metal wire of the plurality of metal wires is associated with only a single one of the plurality of alternating N-type and P-type semiconductor regions, and wherein each metal wire of the plurality of metal wires is continuously undulating between and extending beyond two bonding points coupling the metal wire to the plurality of alternating N-type and P-type semiconductor regions.

16. The method of claim 15, further comprising:
weaving a plurality of insulating wires through the plurality of metal wires.

17. The method of claim 15, wherein electrically connecting the plurality of metal wires to the metal seed layer comprises soldering or welding the plurality of metal wires to the metal seed layer at points along each of the metal wires of the plurality of metal wires.

18. The method of claim 15, wherein the plurality of metal wires is further coupled to a second substrate, the method further comprising:

disconnecting one polarity of the plurality of metal wires between the substrate and the second substrate to form a series connection between the substrate and the second substrate.

19. A solar cell fabricated according to the method of claim 15.

* * * * *

UNITED STATES PATENT AND TRADEMARK OFFICE
CERTIFICATE OF CORRECTION

PATENT NO. : 9,935,213 B2
APPLICATION NO. : 14/752818
DATED : April 3, 2018
INVENTOR(S) : Sewell et al.

Page 1 of 1

It is certified that error appears in the above-identified patent and that said Letters Patent is hereby corrected as shown below:

In the Specification

Column 1, Line 10, add:
-- STATEMENT REGARDING FEDERALLY SPONSORED RESEARCH OR DEVELOPMENT
This invention was made with government support under DE-EE0008175 awarded by The U.S. Department of Energy. The government has certain rights in the invention. --

Signed and Sealed this
Second Day of March, 2021

Drew Hirshfeld
*Performing the Functions and Duties of the*
*Under Secretary of Commerce for Intellectual Property and*
*Director of the United States Patent and Trademark Office*